(12) United States Patent
Kim et al.

(10) Patent No.: US 7,875,193 B2
(45) Date of Patent: Jan. 25, 2011

(54) METHOD FOR MANUFACTURING PROBE STRUCTURE OF PROBE CARD

(75) Inventors: Bong Hwan Kim, Seoul (KR); Jong Bok Kim, Goyang-si (KR); Bum Jin Park, Seoul (KR)

(73) Assignee: UniTest Inc., Suwon-si (KR)

( * ) Notice: Subject to any disclaimer, the term of this patent is extended or adjusted under 35 U.S.C. 154(b) by 748 days.

(21) Appl. No.: 11/760,032

(22) Filed: Jun. 8, 2007

(65) Prior Publication Data

US 2008/0190891 A1    Aug. 14, 2008

(30) Foreign Application Priority Data

Feb. 12, 2007   (KR) .................. 10-2007-0014471

(51) Int. Cl.
*C23F 1/00* (2006.01)

(52) U.S. Cl. ................ 216/2; 216/11; 216/41

(58) Field of Classification Search .............. None
See application file for complete search history.

(56) References Cited

U.S. PATENT DOCUMENTS

| 6,059,982 | A  | * | 5/2000  | Palagonia et al. | 216/11 |
| 7,018,857 | B2 | * | 3/2006  | Kanamaru et al.  | 438/18 |
| 7,528,618 | B2 | * | 5/2009  | Gritters         | 324/754 |
| 7,602,204 | B2 | * | 10/2009 | Lee              | 324/762 |

* cited by examiner

*Primary Examiner*—Duy-Vu N Deo
(74) *Attorney, Agent, or Firm*—Sughrue Mion, PLLC

(57) ABSTRACT

A method for manufacturing a probe structure of a probe card is disclosed. In accordance with the present invention, a portion of a substrate exposed through a crossing region of one or more probe beam regions defined by a first mask layer pattern and a windows defined by a second mask layer pattern are etched to form one or more self-aligning probe tip regions, thereby preventing a misalignment of the one or more probe tip regions.

4 Claims, 4 Drawing Sheets

METHOD FOR MANUFACTURING PROBE STRUCTURE OF PROBE CARD

This is a non-provisional application with claims priority from Korean Patent Application No. 10-2007-14471 filed on Feb. 12, 2007, which is incorporated herein by reference.

BACKGROUND OF THE INVENTION

1. Field of the Invention

The present invention relates to a method for manufacturing a probe structure of a probe card, and more particularly to a method for manufacturing a probe structure of a probe card wherein a portion of a substrate exposed through a crossing region of one more probe beam regions defined by a first mask layer pattern and a windows defined by a second mask layer pattern are etched to form one or more self-aligning probe tip regions, thereby preventing a misalignment of the one or more probe tip regions.

2. Description of the Related Art

Generally, one or more dies are formed on a wafer. A wafer-level test should be carried out to find out that the one or more dies are not defective. The wafer-level test is carried out using a probe card having a plurality of cantilever structure having a probe beam, a tip and a bump. The cantilever structures contact a plurality of pads formed on the wafer, and relays a test signal from a tester to the plurality of pads to carry out the test.

As a size of a semiconductor device is reduced, a pitch of the pads is also reduced. Therefore, a distance between the probe tips for carrying out the test by contacting the pads is also drastically reduced. In addition, a number of the probe tips are drastically increased in order to test a large number of dies per test.

FIGS. 1a through 1e are plane views and cross-sectional views taken along a line A-A of the plane views illustrating a conventional method for manufacturing a probe structure of a probe card.

Referring to FIG. 1a, a first mask layer (not shown) is formed on a substrate 10. Thereafter, the first mask layer is selectively etched to form a first mask layer pattern 20 defining one or more probe beam regions 30.

Referring to FIG. 1b, a second mask layer (not shown) is formed on the substrate 10. Thereafter, the second mask layer is selectively etched to form a second mask layer pattern 50 including one or more windows exposing one or more probe tip regions 40, wherein each of the one or more probe tip regions 40 is disposed at an end portion of each of the one or more probe beam regions 30.

Referring to FIG. 1c, the substrate 10 exposed through the one or more windows is etched to form the one or more probe tip regions 40. Thereafter, the second mask layer pattern 50 is removed.

Referring to FIG. 1d, the substrate 10 exposed by the first mask layer pattern 20 is etched to form the one or more probe beam regions 30. Thereafter, the first mask layer pattern 20 is removed.

Referring to FIG. 1e, the one or more probe beam regions 30 and the one or more probe tip regions 40 are filled to form a probe structure 60.

In accordance with the conventional method for manufacturing the probe structure of the probe card, a probe tip may be formed at an accurate position when a distance between the probe structures is large and the probe tip is larger than a predetermined size. However, when the distance between the probe structures and the size of the probe tip are reduced, the probe tip may not be formed at an accurate position due to a problem of an exposure such as an interference. Therefore, the position of the probe tip region deviates as shown in FIGS. 1b and 1d such that the probe tip is not formed at the accurate position.

SUMMARY OF THE INVENTION

It is an object of the present invention to provide a method for manufacturing a probe structure of a probe card wherein a portion of a substrate exposed through a crossing region of one more probe beam regions defined by a first mask layer pattern and a windows defined by a second mask layer pattern are etched to form one or more self-aligning probe tip regions, thereby preventing a misalignment of the one or more probe tip regions.

In accordance with a first aspect of the present invention, there is provided a method for manufacturing a probe structure, comprising steps of: (a) forming a first mask layer pattern defining one or more probe beam regions on a substrate; (b) forming a second mask layer pattern including a window on the substrate and the first mask layer pattern, the window at least exposing one or more probe tip regions, each of the one or more probe tip regions being disposed at an end portion of each of the one or more probe beam regions; (c) etching the substrate exposed through the window to form the one or more probe tip regions; (d) removing the second mask layer pattern disposed on the substrate and the first mask layer pattern; (e) etching the substrate exposed through the first mask layer pattern to form the one or more probe beam regions; (f) removing the first mask layer pattern; and (g) filling the one or more probe beam regions and the one or more probe tip regions to form the probe structure.

Preferably, the one or more probe beam regions are aligned perpendicular to a lengthwise direction thereof.

It is preferable that the windows exposes the one or more probe tip regions and the first mask layer pattern adjacent to three sides of each of the one or more probe tip regions.

Preferably, the window comprises a rectangular window exposing the one or more probe tip regions simultaneously.

In accordance with a second aspect of the present invention, there is provided a method for manufacturing a probe structure, comprising etching a portion of a substrate exposed through a crossing region of one more probe beam regions defined by a first mask layer pattern and a windows defined by a second mask layer pattern to form one or more self-aligning probe tip regions.

Preferably, the one or more probe beam regions are aligned perpendicular to a lengthwise direction thereof.

It is preferable that the window exposes the first mask layer pattern adjacent to three sides of each of the one or more probe tip regions.

Preferably, the window comprises a rectangular window exposing the one or more probe tip regions simultaneously.

DETAILED DESCRIPTION OF THE INVENTION

The present invention will now be described in detail with reference to the accompanied drawings. The interpretations of the terms and wordings used in Description and Claims should not be limited to common or literal meanings. The embodiments of the present invention are provided to describe the present invention more thoroughly for those skilled in the art.

FIGS. 2a through 2e are plane and cross-sectional views taken along a line B-B of the plane views illustrating a method for manufacturing a probe structure of a probe card in accordance with the present invention.

Figure 1A:
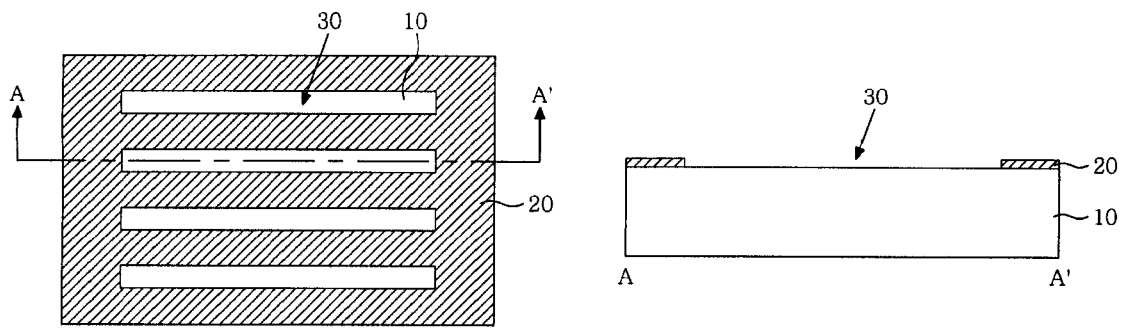
FIGS. 1a through 1e are plane and cross-sectional views illustrating a conventional method for manufacturing a probe structure of a probe card.
Figure 1B:
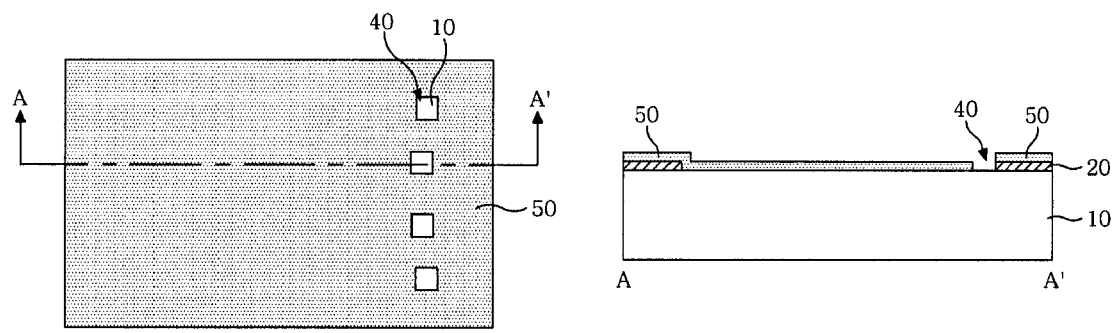
Figure 1C:
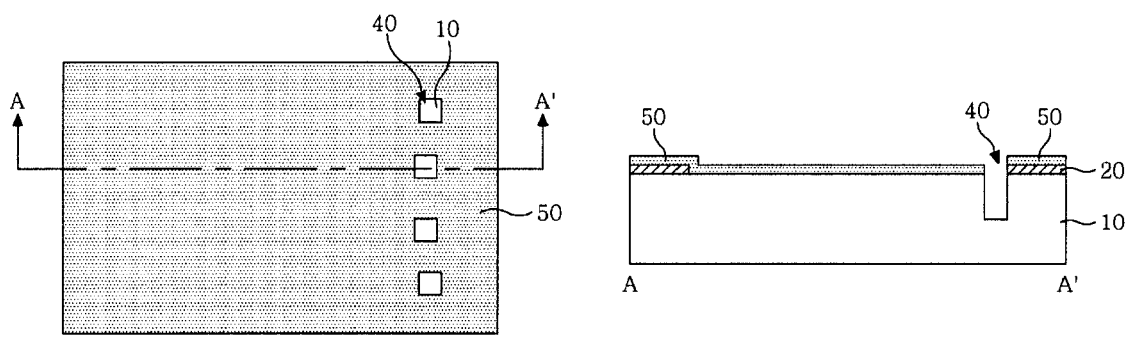
Figure 1D:
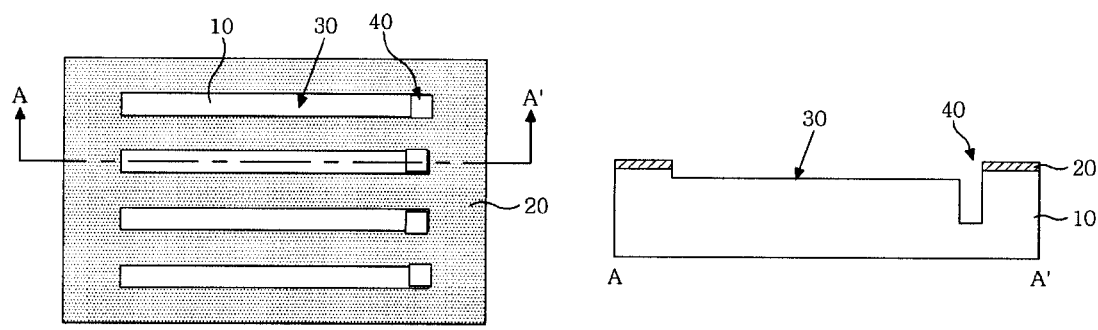
Figure 1E:
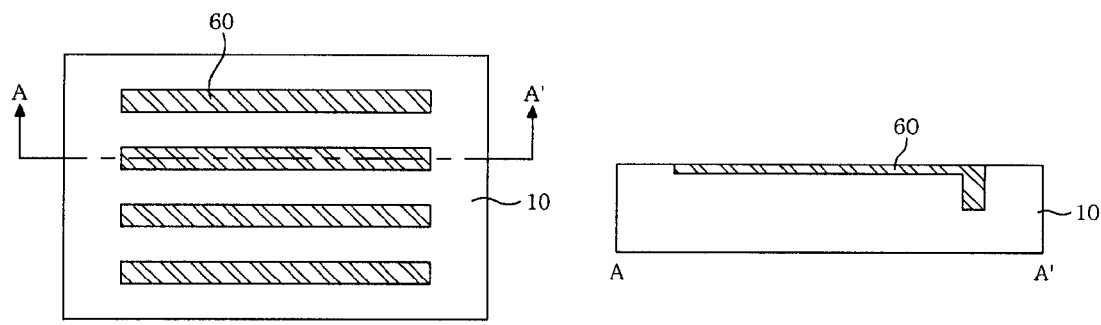
Figure 2A:
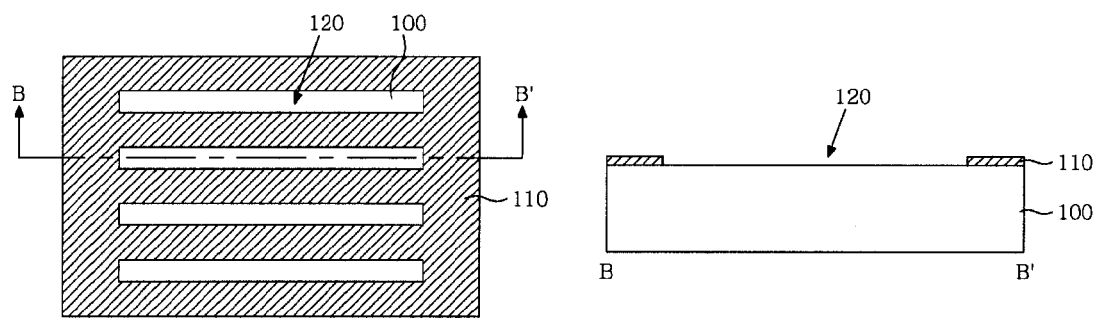
FIGS. 2a through 2e are plane and cross-sectional views illustrating a method for manufacturing a probe structure of a probe card in accordance with the present invention.

Referring to FIG. 2a, a first mask layer (not shown) is formed on a substrate 100. Thereafter, the first mask layer is selectively etched to form a first mask layer pattern 110 defining one or more probe beam region 120.

The one or more probe beam regions 120 may be aligned perpendicular to a lengthwise direction thereof as shown in FIG. 2a.

Figure 2B:
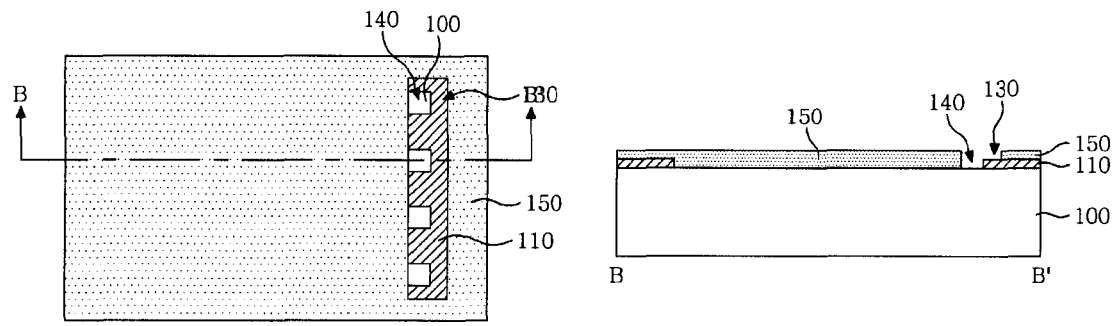

Referring to FIG. 2b, a second mask layer (not shown) is formed on the substrate 100 and the first mask layer pattern 110. Thereafter, the second mask layer is selectively etched to form a second mask layer pattern 150 including a window 130 at least exposing one or more probe tip regions 140, wherein each of the one or more probe tip regions 140 is disposed at an end portion of each of the one or more probe beam regions 120.

It is preferable that the window 130 exposes the one or more probe tip regions 140 and the first mask layer pattern 110 adjacent to three sides of each of the one or more probe tip regions 140. In this case, a probability of an interference occurring in an exposure process is reduced compared to a case that the window 130 exposes only the one or more probe tip regions 140 and the first mask layer pattern 110 between the one or more probe tip regions 140, thereby allowing an accurate exposure.

As shown in FIG. 2b, contrary to the conventional technique wherein a plurality of windows exposing a plurality of probe tip regions are formed, the etching process of the second mask layer is carried out in a manner that a single window is formed.

That is, while a photoresist film pattern exposing a plurality of probe tip regions is formed on the second mask layer and the second mask layer is etched using the photoresist film pattern as a mask to form a second mask layer pattern including the plurality of windows respectively exposing the plurality of probe tip regions in accordance with the conventional technique, a photoresist film pattern simultaneously exposing the one or more probe tip regions is formed on the second mask layer and the second mask layer is etched using the photoresist film pattern as a mask to form the second mask layer pattern including the window 130 simultaneously exposing the on or more probe tip regions 140 in accordance with the present invention.

When the window 130 simultaneously exposing the on or more probe tip regions 140 is formed, a dimension of the window is relatively large. Therefore, an alignment is facile and the interference is minimized so that an accurate mask layer pattern may be formed.

Figure 2C:
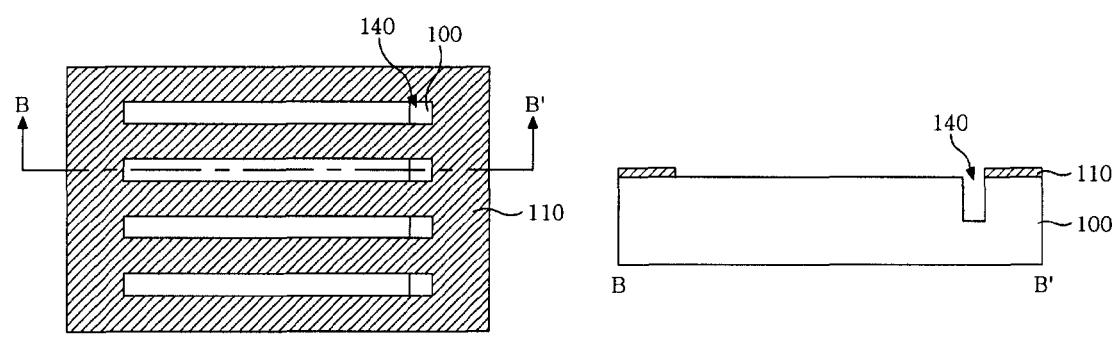

Referring to FIG. 2c, the substrate 100 exposed through the window 130 is etched to form the one or more probe tip regions. That is, the substrate 100 exposed through a crossing point of the one or more probe beam regions 120 defined by the first mask layer pattern 110 and the window 130 defined by the first mask layer pattern 110 is etched to form the one or more self-aligned probe tip regions.

Thereafter, the second mask layer pattern 150 disposed on the substrate 100 and the first mask layer pattern 110 is removed.

Figure 2D:
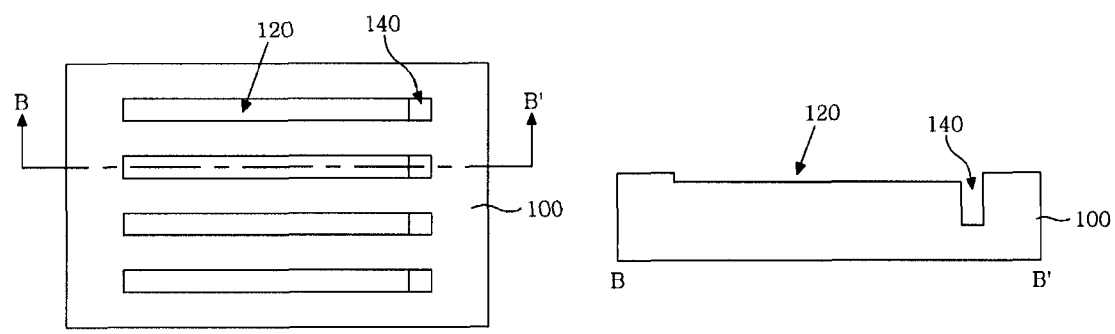

Referring to FIG. 2d, the substrate 100 exposed by the first mask layer pattern 110 is etched to form the one or more probe beam regions 120. Thereafter, the first mask layer pattern 110 is removed.

Figure 2E:
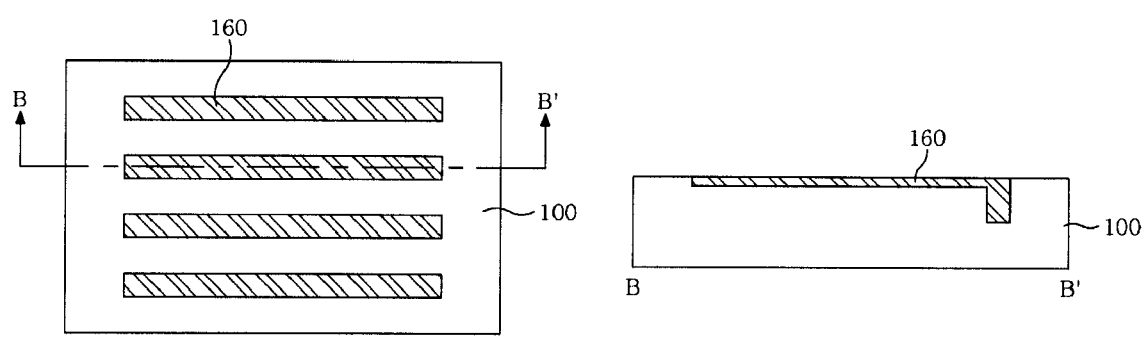

Referring to FIG. 2e, the one or more probe beam regions 120 and the one or more probe tip regions 140 are filled to form a probe structure 160. The probe structure 160 may be formed via an electroplating process.

As described above, in accordance with the present invention, the portion of the substrate exposed through the crossing region of the one more probe beam regions defined by the first mask layer pattern and the windows defined by the second mask layer pattern are etched to form the one or more self-aligning probe tip regions, thereby preventing a misalignment of the one or more probe tip regions and allowing the formation of the probe tip at the accurate position.

What is claimed is:

1. A method for manufacturing a probe structure, comprising steps of:
   (a) forming a first mask layer pattern defining one or more probe beam regions on a substrate;
   (b) forming a second mask layer pattern including a window on the substrate and the first mask layer pattern, the window at least exposing one or more probe tip regions, each of the one or more probe tip regions being disposed at an end portion of each of the one or more probe beam regions;
   (c) etching the substrate exposed through the window to form the one or more probe tip regions;
   (d) removing the second mask layer pattern disposed on the substrate and the first mask layer pattern;
   (e) etching the substrate exposed through the first mask layer pattern to form the one or more probe beam regions;
   (f) removing the first mask layer pattern; and
   (g) filling the one or more probe beam regions and the one or more probe tip regions to form the probe structure.

2. The method in accordance with claim 1, wherein the one or more probe beam regions are aligned perpendicular to a lengthwise direction thereof.

3. The method in accordance with claim 1, wherein the windows exposes the one or more probe tip regions and the first mask layer pattern adjacent to three sides of each of the one or more probe tip regions.

4. The method in accordance with claim 1, wherein the window comprises a rectangular window exposing the one or more probe tip regions simultaneously.

* * * * *